United States Patent

Wensink et al.

[15] 3,676,714

[45] July 11, 1972

[54] SEMICONDUCTOR DEVICE

[72] Inventors: Bernardus Leonardus Wensink; Adriaan Cense, both of Nijmegen, Netherlands

[73] Assignee: U.S. Philips Corporation, New York, N.Y.

[22] Filed: April 1, 1970

[21] Appl. No.: 24,558

[30] Foreign Application Priority Data

April 15, 1969 Netherlands ..........................6906105

[52] U.S. Cl. .......................307/303, 317/235 D, 317/235 Y, 317/235 AA, 317/235 AE

[51] Int. Cl. ........................................................H01l 19/00

[58] Field of Search ....................317/235 Y, 235 AE, 235 E; 307/303

[56] References Cited

UNITED STATES PATENTS

| | | | |
|---|---|---|---|
| 3,573,509 | 4/1971 | Crawford | 317/235 X |
| 3,395,320 | 7/1968 | Ansley | 317/234 |
| 3,502,951 | 3/1970 | Hunts | 317/235 |
| 3,461,324 | 8/1969 | Barry | 307/305 |
| 3,401,319 | 9/1968 | Watkins | 317/235 |
| 3,534,231 | 10/1970 | Biard | 317/235 |
| 3,243,669 | 3/1966 | Sah | 317/234 |
| 3,427,513 | 2/1969 | Hilbiber | 317/235 |

FOREIGN PATENTS OR APPLICATIONS

| | | |
|---|---|---|
| 926,046 | 5/1963 | Great Britain |

OTHER PUBLICATIONS

H. C. Lin et al., Proc. IEEE, Dec. 1964, pp. 1491- 1495

*Primary Examiner*—John W. Huckert
*Assistant Examiner*—William D. Larkins
*Attorney*—Frank R. Trifari

[57] ABSTRACT

A p-n junction isolated integrated circuit bipolar transistor with means to prevent parasitic transistor action between the base of the transistor and the substrate due to accidental forward bias of the base-collector junction. Said means include an auxilliary region disposed in the collector region to collect minority carriers injected into the collector from the base during forward bias. Feedback means connected to the auxilliary region remove the forward bias voltage.

4 Claims, 4 Drawing Figures

Figure 1:
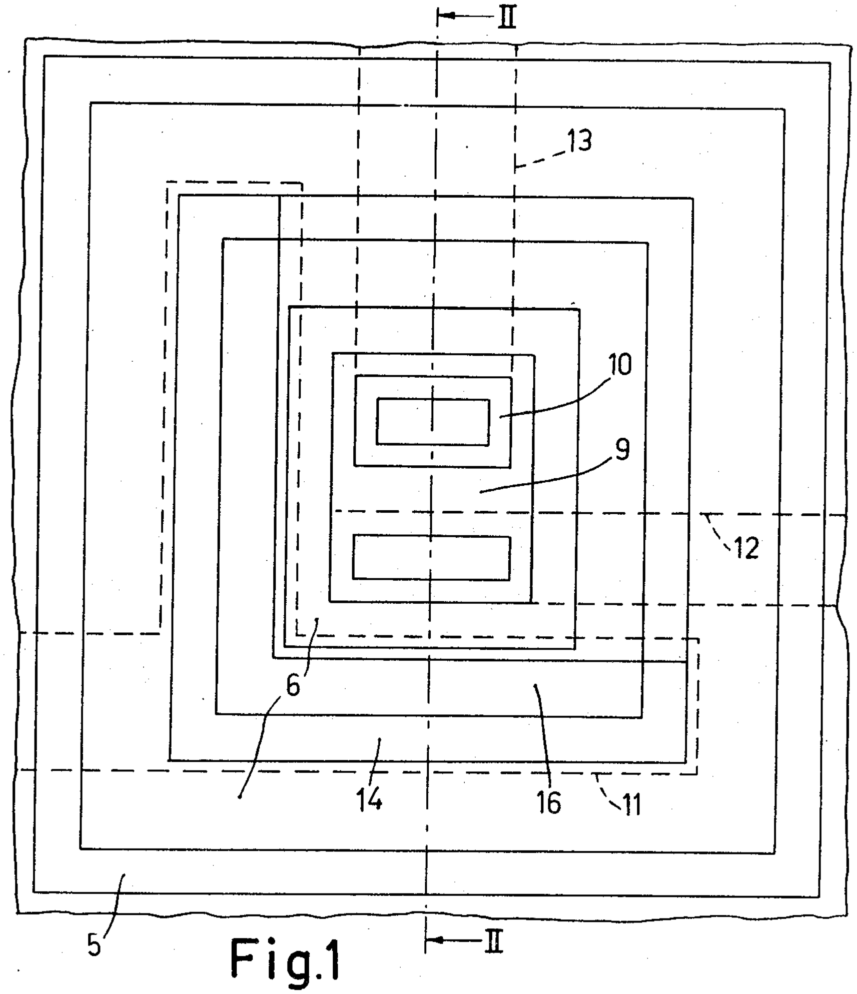

INVENTORS
BERNARDUS L. WENSINK
ADRIAAN CENSE
BY
Frank R. Trifari
AGENT

INVENTOR.
BERNARDUS L.WENSINK
ADRIAAN CENSE
BY
Frank R. Trifari
AGENT

SEMICONDUCTOR DEVICE

The invention relates to a semiconductor device having a semiconductor body comprising a substantially flat surface which is covered at least partly with an insulating layer, a substrate region of a first conductivity type adjoining said surface, and an island-shaped region of the second conductivity type likewise adjoining said surface, said island-shaped region being entirely surrounded in the semiconductor body by the substrate region and forming therewith a p-n junction serving as an electric separation between the said regions, at least a first zone of the first conductivity type which adjoins the surface and is fully surrounded by the island-shaped region being situated in the island-shaped region.

Semiconductor devices of the type described are known and are frequently used, for example, in monolithic integrated circuits. The said first zone forms, for example, the base zone of a transistor which is separated electrically from further circuit elements provided outside the island-shaped region in the semiconductor body by the p-n junction between the island and the substrate region, which p-n junction is biased in the reverse direction in the operating condition. The said first zone together with the island-shaped region may also be used as a diode or form part of other semiconductor structures.

If in the operating condition of such a device the p-n junction between the first zone and the island-shaped region is permanently or temporarily polarized in the forward direction, minority charge carriers will be injected in the island which carriers can be removed via a connection conductor provided on the island. In a transistor, for example, of which the island-shaped region forms the collector zone and the said first zone forms the base zone, the collector-base junction can in certain circumstances be polarized in the forward direction, a flow of minority charge carriers being injected in the collector zone.

The injected minority charge carriers can for a considerable part reach the substrate region since the reversely polarized insulating p-n junction between the island and the substrate collects the minority charge carriers diffused through the island region. The leakage current corresponding therewith is lost so that the efficiency of the device decreases and other circuit technical difficulties can also occur.

It is one of the objects of the invention to remove or at least considerably mitigate the above-mentioned drawbacks occurring in known devices.

The invention is inter alia based on the recognition of the fact that by providing a zone of the second conductivity type in the island-shape region beside the first zone, the leakage current described which is caused by the transistor action of the structure formed by the first zone, the island-shaped region and the substrate region, can be reduced considerably.

A semiconductor device of the type mentioned in the preamble is therefore characterized according to the invention in that a second zone of the first conductivity type which adjoins the surface and is fully surrounded within the semiconductor body by the island-shaped region of the second conductivity type is situated adjacent and spaced from the said first zone and surrounds said first zone substantially entirely, said second zone being provided with a connection conductor.

In contrast with the above-mentioned known devices, in the device according to the invention minority charge carriers which, upon polarization of the p-n junction between the first zone and the island, are injected from the first zone in the island-shaped region are collected for a considerable part by the said second zone. This holds good in particular for the charge carriers which are injected in directions substantially parallel to the surface. Via the connection conductor provided on the second zone, the corresponding electric current can be supplied to another point of the circuit and be used effectively there.

The said effect is still intensified in that as a result of the proximity of the second zone the flow of minority charge carriers injected in a lateral direction in the collector region increases relative to the flow at right angles to the surface. As a result of this a larger part of the overall injected charge carriers is indeed collected by the said second zone.

In order to achieve a maximum collector effect, the lateral transistor formed by the first zone, the second zone and the intermediate island-shaped region preferably should have transistor properties which are as good as possible. Therefore, according to a first important preferred embodiment of the device according to the invention the distance from the first to the second zone measured parallel to the surface is larger than the thickness of the depletion layer which in the normal operating condition extends between the first and the second zone, so that no punch-through occurs in the said lateral transistor as a result of which the potential of the second zone could be influenced in a way which in most cases is undesirable. On the other hand, in order to achieve a collection of minority charge carriers by the second zone which is as efficient as possible, said distance will advantageously be at most equal to the diffusion length of minority charge carriers in the island-shaped region.

The invention is of particular interest in devices in which a transistor is provided in an isolated island. By using the invention and if said transistor is incorporated in a circuit in such manner that in the operating condition the base-collector junction is at least temporarily polarized in the forward direction, the leakage current to the substrate can to a considerable extent be compensated by the second zone. Said leakage current can be removed, for example, via the collector contact. In connection herewith an important preferred embodiment according to the invention is characterized in that a zone of the second conductivity type adjoining the surface is situated within the first zone, is fully surrounded by the first zone and forms the emitter zone of a transistor, the first zone forming the base zone and the island-shaped region forming the collector zone of said transistor.

The charge carrier collected by the second zone can be supplied to any suitably chosen point of the circuit via the connection conductor provided on the second zone. It is of particular advantage, however, when the second zone is electrically connected to the island-shaped region of the second conductivity type by means of the said connection conductor, so that the leakage current can be removed via the connection contact provided on the island.

According to another important preferred embodiment the second zone is electrically connected to a further circuit element situated outside the island-shaped region. This circuit element may be situated outside the semiconductor body. Of particular importance, however, is a preferred embodiment in which said further circuit element is provided in the said semiconductor body and is connected to the second zone via a metal layer situated partly on the insulating layer.

It is to be noted that the signal caused by the said leakage current on the connection conductor connected to the second zone can also be used advantageously to establish in circuits where this is undesirable whether in a given transistor the collector-base junction is polarized in the forward direction. In this case the adjustment of the relative transistor can also be corrected automatically in a simple manner via a suitable feedback coupling of the said signal.

A further important preferred embodiment is characterized in that the island-shaped region below the first zone comprises a buried layer of the second conductivity type which adjoins the substrate region and which extends substantially parallel to the surface and has a higher doping than the remaining part of the island-shaped region. As a result of the presence of said buried layer, minority charge carriers which are injected from the first zone in the island in a direct transverse to the surface, will not reach the p-n junction between the island and the substrate, on the one hand as a result of the electric field incorporated in the island-shaped region due to the presence of the buried layer, and on the other hand by recombination in the buried layer. By using the invention in this case, substantially none of the minority charge carriers injected from the first zone in the island will hence leak away to the substrate.

Finally it is pointed out that it may be of advantage in circumstances to apply a bias voltage in the reverse direction between the second zone and the island-shaped region so as to improve the collector efficiency of the second zone.

Figure 2:
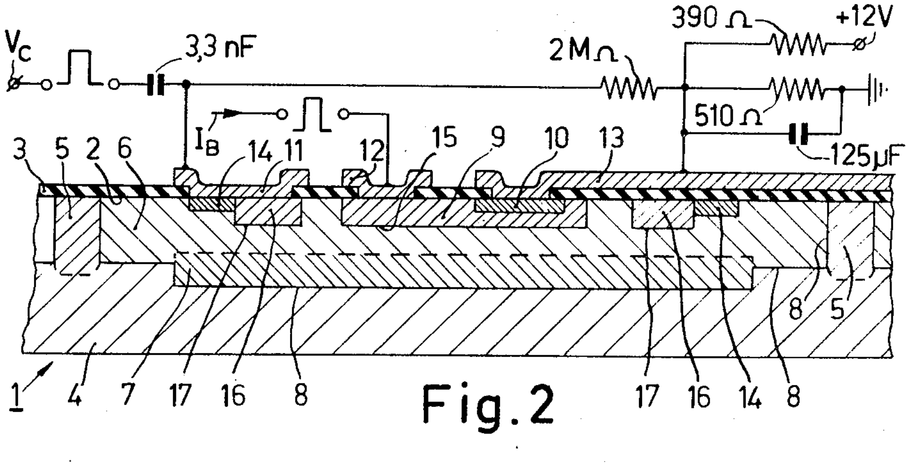

In order that the invention may be readily carried into effect, a few embodiments thereof will now be described in greater detail, by way of example, with reference to the accompanying drawings, in which FIG. 1 is a diagrammatic plan view of a semiconductor device according to the invention, FIG. 2 is a diagrammatic cross-sectional view of the device shown in FIG. 1, taken on the line II—II in FIG. 1.

Figure 3:
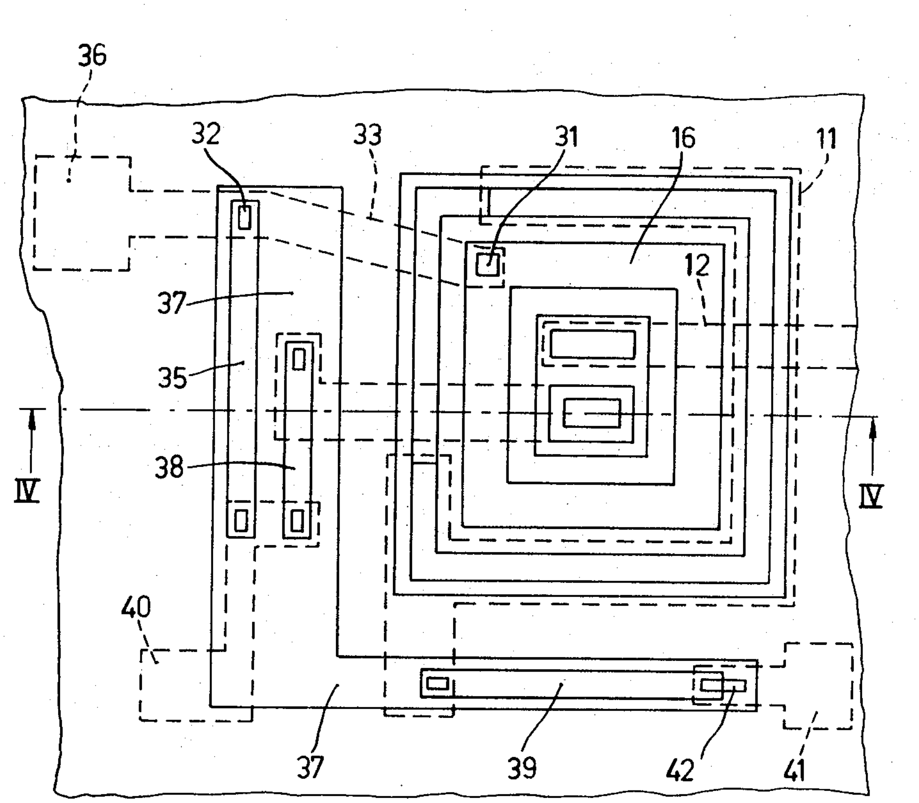
Figure 4:
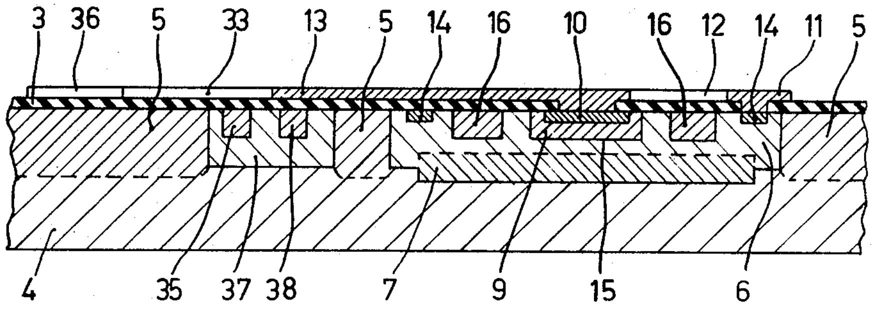

FIG. 3 is a diagrammatic plan view of another device according to the invention, and FIG. 4 is a diagrammatic cross-sectional view of the device shown in FIG. 3, taken on the line IV—IV in FIG. 3.

The figures are diagrammatic and not drawn to scale, in which, for clarity, the dimensions, particularly in the direction of the thickness, are exaggerated. Corresponding parts are referred to by the same reference numerals in FIGS. 1 to 4. The contours of metal layers are shown in broken lines in the plan views. In the diagrammatic cross-sectional views, diffusion in the lateral direction (parallel to the surface) has not been taken into account for simplicity.

FIG. 1 is a plan view and FIG. 2 is a diagrammatic cross-sectional view taken on the line II—II of FIG. 1 of a semiconductor device according to the invention. The device comprises a semiconductor body 1 of silicon having a substantially flat surface 2 which is covered with a silicon oxide layer 3, see FIG. 2. The body comprises a p-type substrate region 4,5 consisting of a part 4 having a resistivity of 3 Ohm.cm and diffused p-type separation channels 5 which adjoin the surface 2.

An n-type conductive island-shaped region (6,7) which is fully surrounded in the semiconductor body by the substrate region (4, 5) furthermore adjoins the surface 2. This island-shaped region consists of a part 6 which is formed by an n-type epitaxial layer of approximately 10 $\mu$m thick and a resistivity of 0.6 ohm.cm and an n-type buried layer 7 which is diffused partly in the epitaxial layer 6 and partly in the substrate region 4 and has a higher doping than the epitaxial layer 6. The n-type island-shaped region 6,7 adjoins the p-type substrate region 4,5 and forms a p-n junction 8 therewith. This p-n junction 8 which is polarized in the reverse direction in the operating condition forms an electric separation or isolation between the substrate 4,5 and the island 6,7.

A first p-type conductive zone 9 which adjoins the surface 2 and is fully surrounded by the island-shaped region 6,7 is provided in the island 6,7, within which first zone an n-type zone 10 adjoining the surface is situated and is fully surrounded by the zone 9. The zone 10 forms the emitter zone of a transistor, the zone 9 of which forms the base zone and the island-shaped region 6,7 forms the collector zone. The zones 6,9 and 10 are connected to aluminum contact layers 11, 12 and 13 via windows in the oxide layer 3. In order to ensure a good low-ohmic contact with the collector zone, a diffused n-type contact zone 14 is provided simultaneously with the emitter diffusion.

FIG. 2 diagrammatically shows a phase detector circuit in which the transistor is incorporated. Positive voltage pulses are supplied to the collector while positive current pulses are superimposed upon the base current $I_B$. Dependent upon the correlation in mutual succession and value of the said pulses, the collector-base junction 15 can temporarily be polarized in the forward direction. Holes will be injected in the n-type island 6,7 via said junction 15. In the above-described transistor said holes will reach, partly via the cut-off p-n junction 8, the separation channels 5 of the substrate region as a result of the transistor effect of the structure formed by the zone 9, the region 6 and the separation channel 5. The resulting leakage current is lost in the substrate.

In order to avoid or mitigate this drawback, according to the invention a p-type conductive second zone 16 adjoining the surface 2 and fully surrounded within the semiconductor body by the n-type region 6 is provided beside the base zone 9, which zone 16 fully surrounds said zone 9 (see FIG. 1) and comprises a connection conductor 11 which in this example also forms the collector contact so that the zone 16 is connected to the region 6. As a result of this the holes injected in the region 6 will be collected for a considerable part by the ring 16 operating as a collector, and said flow can be dissipated via the collector contact 11. The buried layer 7 also gives rise to an electric field in the region between the layer 7 and the zone 9 as a result of which the injected holes will experience a force directed away from the substrate region 4, so that ultimately substantially no holes will leak away in the substrate.

The doping of the region 6 is such that the largest thickness which can be reach by the depletion layer at the p-n junctions 15 or 17 in the region 6, is approximately 3 $\mu$m The distance between the zones 9 and 16 is 10 $\mu$m and is therefore considerably larger than the thickness of the said depletion layer in the operating condition. The diffusion length for holes in the material of the epitaxial layer 6 is approximately 25 $\mu$m. The distance between the zones 9 and 16 hence is smaller than the said diffusion length so that the structure formed by the zones 9, 6 and 16 forms a reasonably good lateral transistor.

The device described can be manufactured according to the conventionally used well-known methods for manufacturing planar structures. The zones 10 and 14 have been obtained by diffusion of phosphorus and have a depth of penetration of 2 $\mu$m. The zones 9 and 16 have been obtained by a diffusion of boron and have a penetration depth of approximately 2.7 $\mu$m.

FIG. 3 is a plan view and FIG. 4 a diagrammatic cross-sectional view taken on the line IV—IV of FIG. 3 of a part of an integrated monolithic circuit comprising a transistor as described in the preceding embodiment, as well as a few resistors. As regards structure and dimensions, the transistor 6, 9, 10 is substantially equal to that shown in FIGS. 1 and 2. The annular zone 16, however, is not connected to the collector zone 6, in contrast with the preceding embodiment, but is electrically connected (see FIG. 3), via contact windows 31 and 32 and an aluminum layer 33 present on the oxide layer 3, to a circuit element situated outside the island 6,7 and being in the form of a resistor 35 and is also electrically connected to an aluminum contact surface 36 situated on the oxide layer. This resistor is formed by a diffused p-type zone provided in another n-type island 37, see also FIG. 4. The emitter zone is connected to a resistor 38 and the collector zone to a resistor 39. The resistors 35 and 38 are connected at their other end to an aluminum contact surface 40 situated on the oxide layer 3, while the collector resistor 39 is connected to a contact surface 41 which is connected to the island 37 via the contact window 42 and an underlying diffused $n^+$ contact zone.

If the contact surface 40 is connected to earth and the contact surface 41 is set up at a fixed positive potential, the transistor will be in bottomed condition when the base current is increased above a given limit value, so that the base-collector junction 15 is polarized in the forward direction. The holes injected by the junction 15 in the base 9 will be collected by the annular zone 16, and the current corresponding therewith will cause a voltage drop across the resistor 35. This voltage drop can be derived, for example, between the contact surfaces 40 and 36 and can be used, if desirable by means of a feedback coupling circuit (not shown), to correct the adjustment of the transistor so that the base-collector junction is again polarized in the reverse direction and the transistor returned to its unbottomed state.

It will be obvious that the invention is not restricted to the examples described, but that many variations are possible to those skilled in the art without departing from the scope of the invention. For example, the invention may also be used advantageously in a diode which is obtained, for example, by omitting the emitter zone 10 in the examples described. The zone 16 can also be connected directly to a circuit element situated outside the semiconductor body. Of course, the invention is also applicable to the complementary structures which are obtained by replacing the above-mentioned conductivity types by their opposite conductivity types. As semiconductor materials may be used materials other than silicon, for example, germanium or III–V compounds, while the oxide layer 3 may be replaced by other materials, for example, silicon nitride or combinations thereof. If desirable, a bias voltage in the reverse direction may also be applied between the zone 16 and the region 6 to improve the collector effect of the zone 16.

What is claimed is

1. A semiconductor device comprising a semiconductor body having a substantially flat surface covered at least partly with an insulating layer, a substrate region of a first conductivity type adjoining said surface, an island-shaped collector region of a second conductivity type adjoining said surface and nested within the substrate region forming therewith an isolating p-n junction, a first base zone of the first conductivity type adjoining the surface and nested within the collector region, a second zone of the first conductivity type adjoining the surface and nested within the collector region and located adjacent but spaced from the first zone and substantially entirely surrounding the first zone, a third emitter zone of the second conductivity type nested within the first base zone, an emitter contact to the emitter zone, a base contact to the base zone, a collector contact to the collector region, a contact which is separate from the collector contact to the second zone, a connection to the substrate region, means for applying to the contacts and connection potentials such that the isolating junction is reverse biased, the emitter-base junction is forward biased and the base-collector junction is normally reverse biased but at least temporarily becomes forward biased causing undesirable injection of carriers into the collector region, an impedance coupled to the second zone contact for developing a voltage upon collection of said undesirable injected carriers, and means for feeding back said voltage to prevent the undesirable carrier injection.

2. A semiconductor device as set forth in claim 1 wherein the temporary forward biasing occurs when the transistor formed by the emitter, base and collector zones bottoms, and the feedback means is connected to prevent transistor bottoming.

3. A semiconductor device as set forth in claim 1 wherein the spacing of the first zone to the second zone measured parallel to the surface is larger than the width of the depletion layer which in the operating condition extends between the first and second zones but is smaller than the diffusion length for minority carriers in the collector region.

4. A semiconductor device as set forth in claim 3 wherein a buried layer of the second conductivity type and of a higher conductivity than the collector zone extends below the base zone.

* * * * *

FO-1050
(5/69)

UNITED STATES PATENT OFFICE

CERTIFICATE OF CORRECTION

Patent No. 3,676,714 Dated July 11, 1972

Inventor(s) BERNARDUS LEONARDUS WENSINK and ADRIAAN CENSE

It is certified that error appears in the above-identified patent and that said Letters Patent are hereby corrected as shown below:

Title Page, [30] Foreign Application Priority Data, the date should read -- April 18, 1969.

Signed and sealed this 6th day of March 1973.

(SEAL)
Attest:

EDWARD M.FLETCHER,JR.
Attesting Officer

ROBERT GOTTSCHALK
Commissioner of Patents